(12) United States Patent
Yagishita et al.

(10) Patent No.: US 7,198,994 B2
(45) Date of Patent: Apr. 3, 2007

(54) SEMICONDUCTOR DEVICE AND MANUFACTURING METHOD OF SEMICONDUCTOR DEVICE

(75) Inventors: Atsushi Yagishita, Yokohama (JP); Tomohiro Saito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 288 days.

(21) Appl. No.: 10/991,485

(22) Filed: Nov. 19, 2004

(65) Prior Publication Data
US 2005/0093035 A1 May 5, 2005

Related U.S. Application Data

(62) Division of application No. 10/393,017, filed on Mar. 21, 2003, now Pat. No. 6,879,001.

(30) Foreign Application Priority Data
Mar. 29, 2002 (JP) ............................. P2002-95879

(51) Int. Cl.
*H01L 21/00* (2006.01)
*H01L 21/84* (2006.01)
(52) U.S. Cl. ........................ 438/154; 438/199; 438/275
(58) Field of Classification Search ................ 438/197, 438/199, 153–154, 157, 275
See application file for complete search history.

(56) References Cited

U.S. PATENT DOCUMENTS 4,996,574 A    2/1991  Shirasaki
6,020,024 A    2/2000  Maiti et al.
6,054,355 A    4/2000  Inumiya et al.
6,252,284 B1   6/2001  Muller et al.
6,333,532 B1  12/2001  Davari et al.
6,358,783 B1   3/2002  Yamaguchi et al.
6,630,710 B1 * 10/2003  Augusto ..................... 257/327
6,734,501 B2   5/2004  Sugano et al.
6,964,893 B2 * 11/2005  Matsuo ....................... 438/199

FOREIGN PATENT DOCUMENTS

JP      2001-257357     9/2001
WO      WO 00/57480     9/0000

OTHER PUBLICATIONS

Yagishita et al., "High Performance Damascene Metal Gate MOSFET's for 0.1 μm Regime," IEEE Transactions on Electron Devices (May 2000), 47:1028-34.
Office Action issued by Chinese Patent Office, dated Aug. 6, 2004, in Chinese Application No. 03121578.6 and English-language translation thereof.

* cited by examiner

*Primary Examiner*—Thanhha S. Pham
(74) *Attorney, Agent, or Firm*—Finnegan, Henderson, Farabow, Garrett & Dunner, L.L.P.

(57) ABSTRACT

Dummy gate patterns 111, 112 are formed on a silicon active layer 103 of an SOI substrate, and thereafter, these dummy gate patterns 111, 112 are removed to form gate grooves 130, 132. A threshold voltage of each transistor is adjusted by etching a silicon active layer 103 in any one of these gate, grooves 130, 132 to reduce a thickness of a portion constituting a channel region. This enables the enhancement of freedom degree and so on in circuit designing according to conditions.

2 Claims, 10 Drawing Sheets

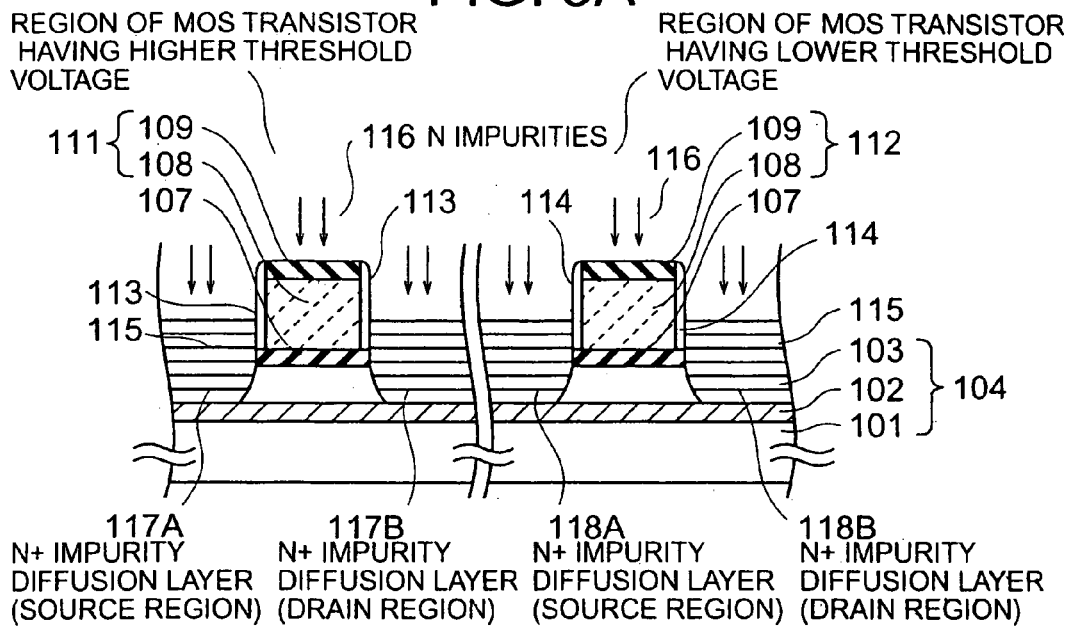
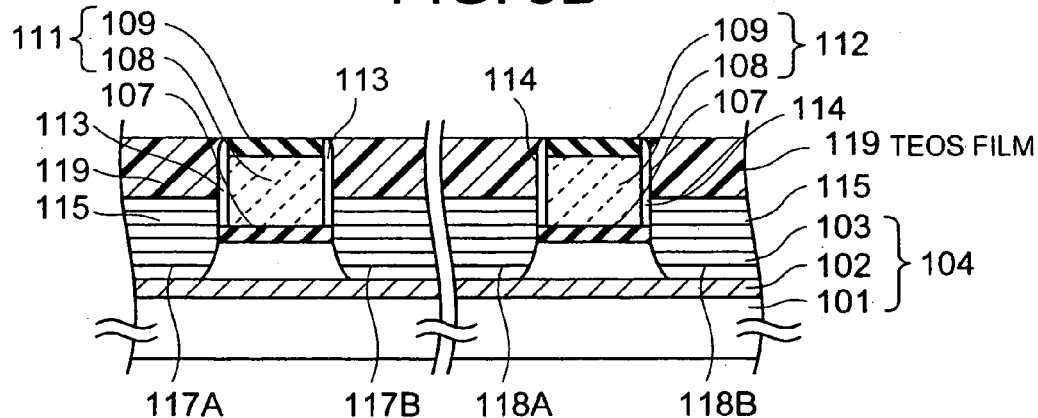
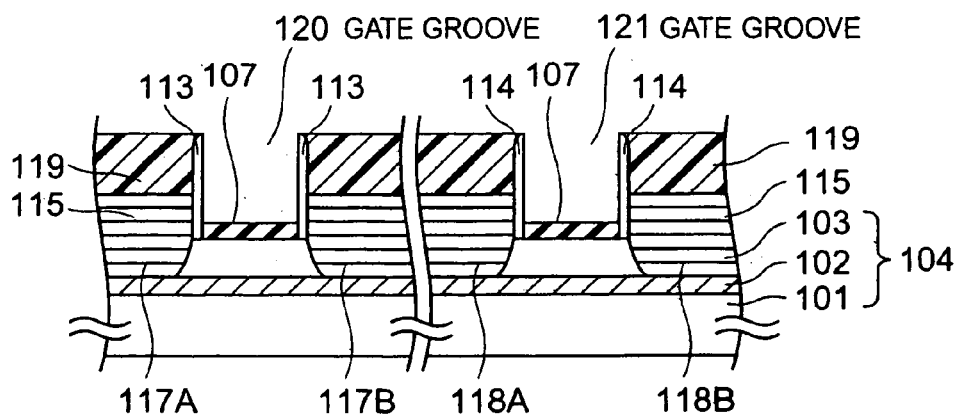

220 MOS TRANSISTOR HAVING HIGHER THRESHOLD VOLTAGE

221 MOS TRANSISTOR HAVING LOWER THRESHOLD VOLTAGE

SEMICONDUCTOR DEVICE AND MANUFACTURING METHOD OF SEMICONDUCTOR DEVICE

CROSSREFERENCE TO RELATED APPLICATIONS

This is a division of application Ser. No. 10/393,017, filed Mar. 21, 2003, now U.S. Pat. No. 6,879,001, which is incorporated herein by reference.

This, application is based upon and claims the benefit of priority from the prior Japanese Patent Application No. 2002-95879, filed on Mar. 29, 2002; the entire contents of which are incorporated herein by reference.

BACKGROUND OF THE INVENTION

1. Field of the Invention

The present invention relates to a semiconductor device and a manufacturing method of a semiconductor device.

2. Description of the Related Art

Currently, in manufacturing high-performance semiconductor transistors, so-called SOI (Silicon-On-Insulator) substrates (substrates each having a buried insulation film such as a silicon oxide film interposed between a silicon supporting substrate and a surface silicon layer) are beginning to be in use, instead of monocrystalline silicon substrates, in order to realize improvement in the operation speed and reduction in power consumption of the semiconductor transistors.

The semiconductor transistors using the SOI substrates are roughly classified into fully-depleted (FD) SOI transistors, partially-depleted SOI transistors, and so on. The fully-depleted SOI transistor among these transistors has advantages of enabling reduction in power consumption by a low parasitic capacitance, enabling the use of a so-called metal gate (the change of a material of a gate electrode from polycrystalline silicon to metal) by a low threshold voltage, and so on.

In this fully-depleted SOI transistor, a region surrounded by a source region, a drain region, and a buried insulation film is substantially fully depleted while in operation. This naturally necessitates making the thickness of a silicon active layer of the SOI substrate smaller than that in the case of the partially-depleted SOI transistor.

As the fully-depleted SOI transistor, those having a double gate structure in which a channel region is sandwiched by two gate electrode layers have been developed. The use of the double gate structure makes it possible to enhance controllability in forming the gate electrode layers and to further promote structure miniaturization. This also makes it possible to lower impurity concentration in the channel region to thereby alleviate impurity scattering and an electric field in a depth direction of the channel region. Consequently, in the transistor, it is possible to enhance carrier mobility in the channel region to increase a drive current. Further, since the transistor is operated while the channel region is in a completely depleted state, it is possible to lower a so-called S-factor to an ideal value of about 60 mV/decade to lower a threshold voltage value of the transistor.

SUMMARY OF THE INVENTION

The present invention relates to a semiconductor device, including: a semiconductor substrate; an insulation film formed on the semiconductor substrate; a silicon layer which is formed on the insulation film and which has a source region, a drain region, and a channel region with a thickness of 10 nm or smaller formed between the source region and the drain region; a gate insulation film formed over the channel region; and a gate electrode layer formed over the gate insulation film.

The present invention also relates to a semiconductor device including: a semiconductor substrate; an insulation film formed on the semiconductor substrate; a silicon layer which is formed on the insulation film and which has a first and a second source region, a first and a second drain region, and a first and a second channel region formed between the first source region and the first drain region, between the second source region and the second drain region, respectively, and at least one of the first and the second channel regions having a thickness of 10 nm or smaller; a first and a second gate insulation film formed over the first and the second channel region respectively; and a first and a second gate electrode layer formed over the first and the second gate insulation film respectively.

The present invention also relates to a semiconductor device including: a semiconductor substrate; an insulation film formed on the semiconductor substrate; a silicon layer which is formed on the insulation film and which has a source region, a drain region, and a channel region formed between the source region and the drain region and having a first and a second side face not facing the source region nor the drain region, an interval between the first and the second side face being 10 nm or smaller; a gate insulation film formed over at least either the first or the second side face; and a gate electrode layer formed over the gate insulation film.

The present invention relates to a manufacturing method of a semiconductor device including: forming a first and a second dummy gate pattern on a silicon layer formed over a semiconductor substrate via an insulation film; forming impurity diffusion layers at positions of source regions and drain regions by introducing impurities into the silicon layer, using the first and the second dummy gate pattern as masks; forming an insulation film over the silicon layer so as to bury the first and the second dummy gate pattern; removing the first and the second dummy gate pattern to form a first and a second groove in the insulation film; etching the silicon layer in the first groove to reduce a thickness of a portion corresponding to a channel region of the silicon layer; forming gate insulation films over the silicon layer in the first and the second groove; and forming gate electrode layers over the gate insulation films in the first and the second groove.

The present invention also relates to a manufacturing method of a semiconductor device including: forming a first and a second dummy gate pattern on a silicon layer formed over a semiconductor substrate via an insulation film; forming impurity diffusion layers at positions of source regions and drain regions by introducing impurities into the silicon layer, using the first and the second dummy gate pattern as masks; forming an insulation film over the silicon layer so as to bury the first and the second dummy gate pattern; removing the first dummy gate pattern to form a first groove in the insulation film; forming a silicon oxide film at a position of a channel region of the silicon layer in the first groove; removing the silicon oxide film to reduce a thickness of a portion corresponding to the channel region of the silicon layer; removing the second dummy gate pattern to form a second groove in the insulation film; forming gate insulation films over the channel regions of the silicon layer; and forming gate electrodes over the gate insulation films.

BRIEF DESCRIPTION OF THE DRAWINGS

FIGS. 1A and 1B, FIGS. 2A to 2C, FIGS. 3A to 3C, and FIGS. 4A to 4C are cross sectional views each showing a section of a semiconductor device according to a first embodiment of the present invention during manufacturing processes of this semiconductor device.

DETAILED DESCRIPTION

Embodiments of the present invention will be explained in detail below with reference to the drawings.

(First Embodiment)

This embodiment will be explained with reference to FIG. 1A to FIG. 4C. In this embodiment, such a case will be explained as an example where a plurality of n-type MOS transistors having different threshold voltage values are formed on a common semiconductor substrate (for example, an SOI (Silicon-On-Insulator) substrate).

Figure 1A:
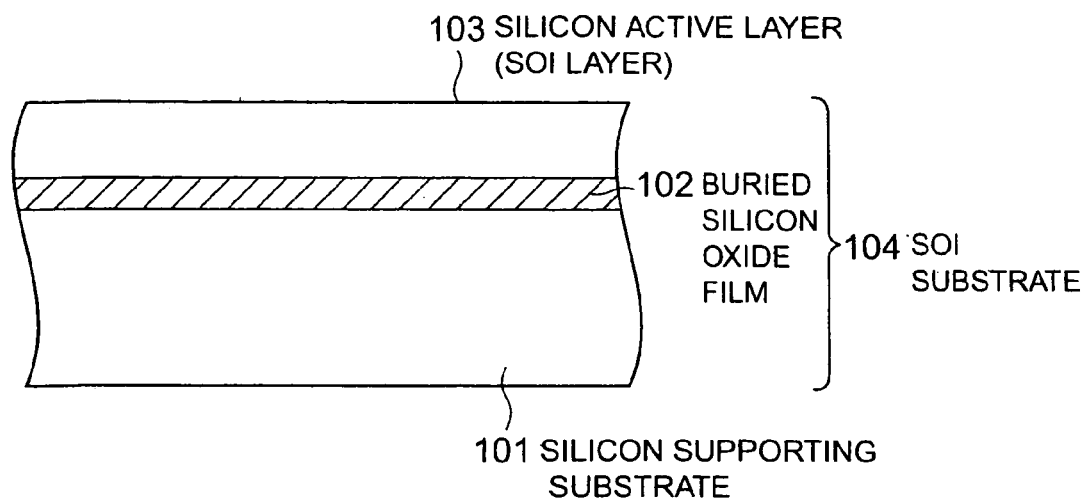
Figure 1B:
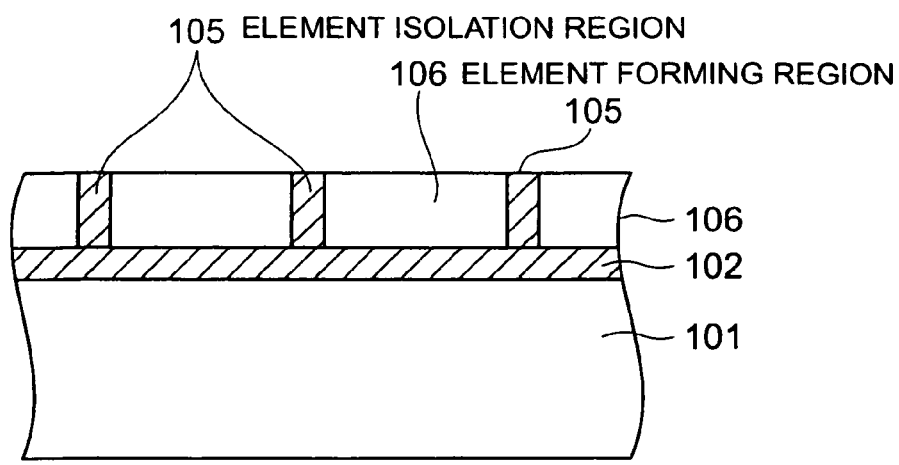

FIGS. 1A and 1B are cross sectional views of an SOI (Silicon-On-Insulator) substrate cut along a depth direction (thickness direction) thereof.

FIGS. 2A to 4C are cross sectional views of n-type MOS transistors formed on the SOI substrate cut along a perpendicular direction to a longitudinal direction of a gate electrode layer.

In this embodiment, using an SOI substrate 104 shown in FIG. 1A, dummy gate patterns are formed in regions inside predetermined element forming regions where gate electrode layers are to be formed, thereby forming the plural n-type MOS transistors.

As shown in FIG. 1A, a silicon active layer (SOI layer) 103 to which film-thinning has been applied up to a predetermined thickness is formed over a silicon supporting substrate 101 via a buried silicon oxide film 102. In other words, the SOI substrate 104 is constituted of the silicon supporting substrate 101, the buried silicon oxide film 102, and the SOI layer 103. The thickness of the SOI layer 103 is, for example, 30 nm.

Incidentally, usable in this embodiment are SOI (Silicon-On-Insulator) substrates formed by appropriate methods such as a generally known bonding method, SIMOX (Separation by Implanted Oxygen) method, and the like according to design conditions and so on.

Next, as shown in FIG. 1B, a plurality of shallow-trench-type element isolation regions (STI regions: Shallow-Trench-Isolation) 105 are formed in the silicon active layer (SOI layer) 103. The element isolation regions 105 can be formed through the processes of etching, film growth, and so on. Regions between the element isolation regions 105 are used as element forming regions 106 where semiconductor elements such as MOS transistors are to be formed.

Next, as shown in FIG. 2A to FIG. 4C, a plurality of fully-depleted SOI transistors are formed on the SOI substrate 104. These fully-depleted SOI transistors are n-type transistors having different threshold voltages.

Figure 2A:
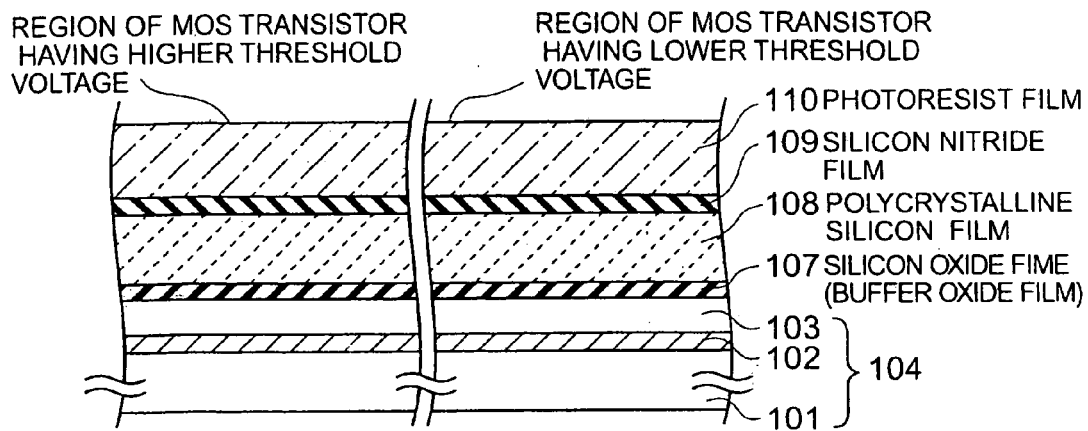

First, as shown in FIG. 2A, a silicon oxide film (buffer oxide film) 107, a polycrystalline silicon film 108, a silicon nitride film (SiNx film) 109, and a photoresist film 110 are formed in sequence over the silicon active layer (SOI layer) 103 of the SOI substrate 104.

In the process of forming these films, the silicon oxide film (buffer oxide film) 107 is first formed thinly to have a thickness of about 3 nm over a surface of the silicon active layer (SOI layer) 103 of the SOI substrate 104. Thereafter, the polycrystalline silicon film 108 is formed to have a thickness of about 150 nm over the silicon oxide film 107, and the silicon nitride film (SiNx film) 109 is subsequently formed to have a thickness of about 30 nm.

Next, using electron beams or the like, the photoresist film 110 is processed following the shape and the size of gate electrode layers to form a mask pattern. Thereafter, using this mask pattern, the silicon nitride film 109, the polycrystalline silicon film 108, and the silicon oxide film (buffer oxide film) 107 are processed in this order by a dry etching technique such as an RIE method. As this dry etching technique, a reactive ion etching method (hereinafter, referred to as an RIE method) is usable. The silicon nitride film 109, the polycrystalline silicon film 108, the silicon oxide film 107 are etched in this order and a gate pattern is transferred.

Figure 2B:
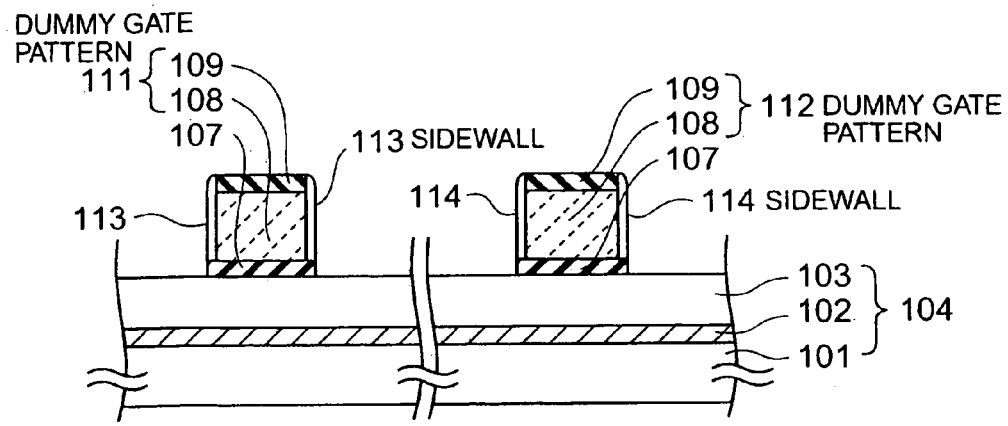

In this manner, as shown in FIG. 2B, dummy gate patterns 111, 112 are formed at predetermined positions on the silicon active layer (SOI layer) 103. Thereafter, sidewalls 113, 114 are formed along both side faces of the dummy gate patterns 111, 112, using a silicon nitride film (SiNx film) or the like.

As described above, each of the dummy gate patterns 111, 112 is formed on the silicon active layer (SOI layer) 103 as a layered pattern constituted of the silicon oxide film 107, the polycrystalline silicon film 108, and the silicon nitride film 109.

Figure 2C:
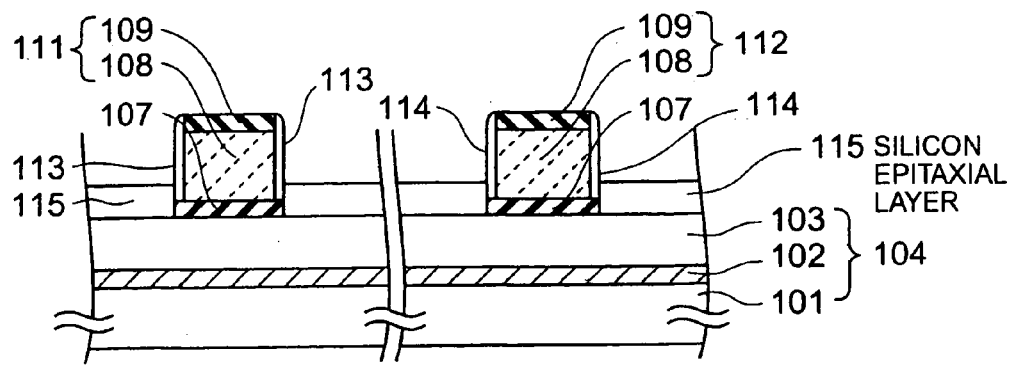

Next, as shown in FIG. 2C, silicon epitaxial layers 115 are formed on both sides of the sidewalls 113, 114 on the silicon active layer (SOI layer) 103, using an epitaxial growth method. The purpose thereof is to increase the thickness of portions of the silicon layer (SOI layer) 103 where source regions and drain regions are to be formed.

Next, as shown in FIG. 3A, with the dummy gate patterns 111, 112 and the sidewalls 113, 114 as masks, n impurities (P (phosphorus) or As (arsenic)) 116 are introduced to positions of the source regions and the drain regions of the silicon active layer (SOI layer), using an ion implantation method or the like. Thereafter, heat treatment is applied to the SOI substrate 104 to activate the impurities 116 so that high-concentration n+ impurity diffusion layers 117A, 117B, 118A, 118B are formed. Here, the high-concentration n+ impurity diffusion layers 117A, 118A constitute the source regions, and the high-concentration n+impurity diffusion layers 117B, 118B constitute the drain regions.

Next, as shown in FIG. 3B, a TEOS film (tetraethoxysilane film) 119 is deposited to have a film thickness of about 230 nm as an interlayer insulation film, and thereafter, the entire surface is flattened by a CMP (Chemical Mechanical Polishing) method or the like to expose surfaces of the dummy gate patterns 111, 112.

Next, as shown in FIG. 3C, the dummy gate patterns 111, 112 are removed to form gate grooves 120, 121 over the silicon active layer 103.

In removing the dummy gate patterns 111, 112, the patterns of the silicon nitride films 109A, 109B are first removed by etching using thermal phosphoric acid, and the patterns of the polycrystalline silicon films 108 buried in the TEOS film 119 are subsequently removed by a CDE method (Chemical Dry Etching method).

Next, the MOS transistors having different threshold voltages are formed separately on the same semiconductor substrate, namely, the SOI substrate 104. Here, as an example, a MOS transistor having a higher threshold voltage and then a MOS transistor having a lower threshold voltage are formed in sequence on the same SOI substrate 104.

Figure 4A:
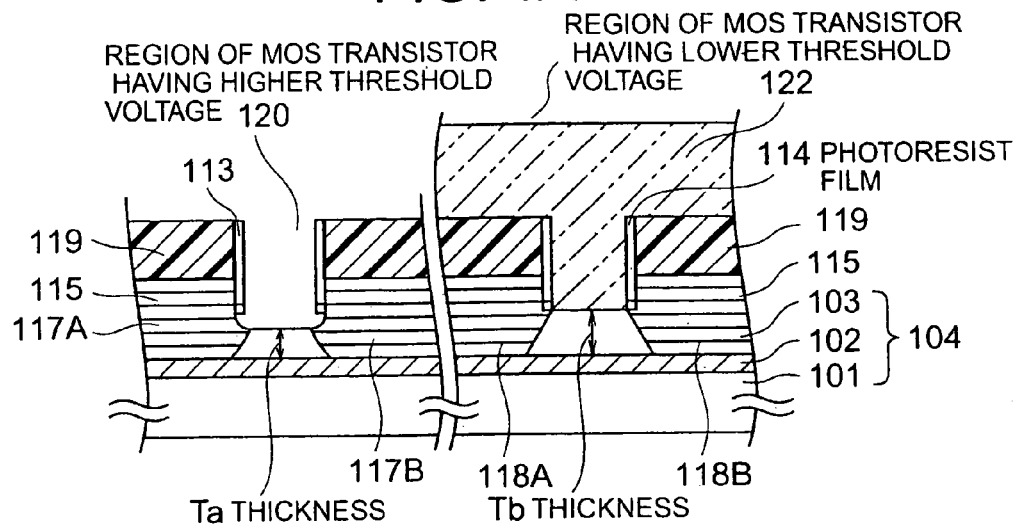

First, as shown in FIG. 4A, a region in which the MOS transistor having the lower threshold voltage is to be formed is covered with a photoresist film 122. Thereafter, in this state, the silicon oxide film 107 lying on a bottom portion of the gate groove 120 is removed using hydrofluoric acid (HF) or the like in a region where the MOS transistor having the higher threshold voltage is to be formed, and thereafter, recessing is carried out using a CDE method, an RIE method, or the like to reduce the thickness of the silicon active layer (SOI layer) 103 in a depth direction. Here, the recessing is controlled to reduce the thickness of the remaining silicon active layer (SOI layer) 103 to about 5 nm (50 Å).

Here, the thickness of the silicon active layer (SOI layer) 103 that constitutes a channel region of the MOS transistor having the higher threshold voltage is denoted by Ta, and the thickness of the silicon active layer (SOI layer) 103 of the MOS transistor having the lower threshold voltage is denoted by Tb.

Figure 4B:
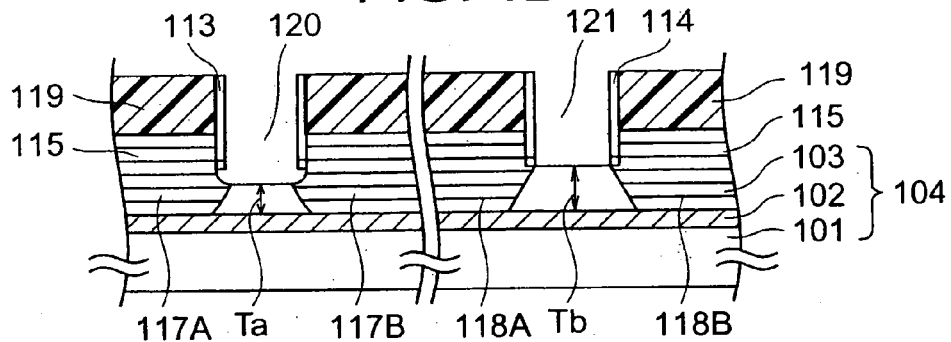

Next, as shown in FIG. 4B, the photoresist film 122 is removed by ashing through the use of oxygen plasma or the like. Meanwhile, in the region where the transistor having the lower threshold voltage is to be formed, recessing is not applied to the silicon active layer (SOI layer) 103 so that the thickness Tb of about 30 nm (300 Å) is maintained. As a result, the thickness Ta of the silicon active layer 103 becomes about 5 nm in the MOS transistor having the higher threshold voltage while the thickness Tb of the silicon active layer 103 becomes about 30 nm in the MOS transistor having the lower threshold voltage.

Figure 4C:
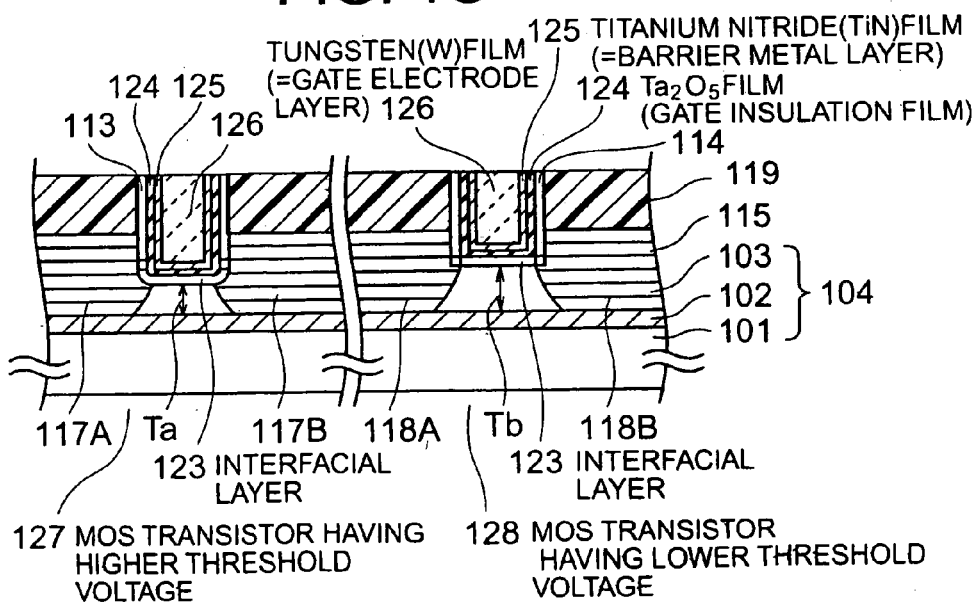

Next, as shown in FIG. 4C, a gate insulation film and subsequently a gate electrode layer are formed, being buried in each of the gate grooves 120, 121, to form the n-type MOS transistors having different threshold voltages. Here, in order to achieve high speed and good controllability in each of the n-type MOS transistors, a high-permittivity film or the like is used as a material of the gate insulation film and metal is used as a material of the gate electrode layer (a so-called metal gate electrode layer is formed).

In each of the gate grooves 120, 121, a $Ta_2O_5$ film 124 which is a high permittivity film is formed as the gate insulation film via a interfacial layer 123 (for example, an oxynitride film (NO film)). Thereafter, a titanium nitride film (TiN film) 125 constituting a barrier metal layer and a tungsten (W) film 126 as the gate electrode layer are formed being buried. Thus, high-permittivity $Ta_2O_5$ is used as the material of the gate insulation film, and tungsten (W), which is high melting point metal, is used as the material of the gate electrode layer (the metal gate electrode layer is formed). In the foregoing manner, a MOS transistor 127 having the higher threshold voltage and a MOS transistor 128 having the lower threshold voltage are formed on the SOI substrate 104.

As a specific procedure, the gate insulation film and the buried gate electrode of each of the MOS transistors are formed in sequence, using a damascene gate process as will be described below.

First, in order to remove a natural oxide film and so on in each of the bottom portions of the gate grooves 120, 121, hydrofluoric acid (HF) treatment is conducted to expose the surface of the silicon active layer (SOI layer) 103. Thereafter, the interfacial layer 123 (for example, an oxynitride film (NO film)) is formed to have a thickness of about 0.7 nm, using a CVD (Chemical Vapor Deposition) method or the like. Next, the $Ta_2O_5$ film 124 is formed thereover to have a film thickness of about 3 nm as the gate insulation film, using a CVD method or the like.

Next, the titanium nitride film (TiN film) 125 is formed to have a film thickness of 5 nm as the material of the barrier metal layer, using a CVD method or the like. Thereafter, the tungsten film (W film) 126 is formed in a layered state to have a film thickness of about 150 nm as the material of the gate electrode layer, using a CVD method, a blanket growth method, or the like.

Next, the titanium nitride (TiN) films 125 and the tungsten (W) films 126 are partly removed by a CMP method or the like to flatten the entire surface above the silicon active layer (SOI layer) 103. As a result, the gate electrode layers formed of tungsten (W) left buried inside the gate grooves 120, 121 are formed.

In the MOS transistors, the tungsten (W) films 126 buried inside the gate grooves 120, 121 serve as the gate electrode layers, and become constituent elements of the MOS transistors along with the source regions and the drain regions (the impurity diffusion layers 117A, 117B, 118A, 118B).

Here, the use of the $Ta_2O_5$ films (gate insulation films) 124 causes the MOS transistors to have a performance characteristic (controllability) corresponding to that of a film thickness of 1.5 nm or smaller in terms of a film thickness of a silicon oxide film or the like. Consequently, the use of the high-permittivity $Ta_2O_5$ films 124 enables the enhancement in controllability of the MOS transistors.

In MOS transistor forming processes, heat treatment at a high temperature of about 800° C. to about 1000° C. is generally conducted after a gate insulation film and a gate electrode layer are formed. As a result, atoms of metal constituting the gate electrode layer (metal gate electrode layer) diffuse into the gate insulation film to easily cause deterioration in withstand voltage of the gate insulation film. In addition, a low relative permittivity thin film is formed on an interface between a high permittivity film (high-k film) such as the $Ta_2O_5$ film 124 and the silicon active layer (SOI layer) 103 to greatly increase an effective film thickness of the gate insulation film so that controllability is liable to get low.

In contrast, according to this embodiment, the source regions and the drain regions are formed prior to the gate electrode layers in MOS transistor forming processes. Therefore, heat treatment at a high temperature of 450° C. or higher is not especially required after the gate electrode layers are formed. Hence, for the gate insulation film, usable besides the $Ta_2O_5$ film as a high-permittivity film or in some cases a ferroelectric film are a $TiO_2$ film, an SiN film, a $BaTiO_3$ film, an $SrTiO_3$ film, an $HfO_2$ film, a $ZrO_2$ film, a $La_2O_3$ film, a $Gd_2O_3$ film, a $Y_2O_3$ film, a $CaF_2$ film, a $CaSnF_2$ film, a $CeO_2$ film, a Yttria Stabilized Zirconia film, an $Al_2O_3$ film, a $ZrSiO_4$ film, an $HfSiO_4$ film, a $Gd_2SiO_5$ film, a $2La_2O_3$ film/$3SiO_2$ film (layered film), and so on. Further, for the gate electrode layer, TiN, WN, Al, Ru, W, Co, Ta, Pt, WSi and so on, alloys or layered structures of these materials are usable besides tungsten (W) as a metal material. Gate electrodes consisting of different materials can exist in the same wafer.

Next, a wiring layer structure and so on are formed in an upper layer of each of the MOS transistors formed in the foregoing manner. Specifically, a TEOS film is formed as an interlayer insulation film by a CVD method or the like.

Thereafter, contact holes are formed in the TEOS film at respective positions above the gate electrode layer, the source region, and the drain region, and then, a metal wiring layer (for example, a copper (Cu) wiring layer) in the upper layer is formed to establish electrical connection to the gate electrode layer, the source region, and the drain region.

In the foregoing manner, the plural fully-depleted n-type MOS transistors having different threshold voltages are formed on the SOI substrate 104. Here, in the transistor 128 having the lower threshold voltage, the thickness Tb of the silicon active layer (SOI layer) 103 constituting the channel region is about 30 nm (300 Å), which causes the threshold voltage value to be about 0.15 V. Meanwhile, in the MOS transistor 127 having the higher threshold voltage, the thickness Ta of the silicon active layer (SOI layer) 103 constituting the channel region is about 5 nm (50 Å), which causes the threshold voltage value to be about 0.5 V.

When a metal material is used as a gate electrode layer, a threshold voltage value of a transistor increases more easily than in the case when polycrystalline silicon is used, as described above. In this embodiment, the thickness of the silicon active layer (SOI layer) 103 constituting the channel region is made as small as about 30 nm, which enables the reduction in the threshold voltage value of the transistor to about 0.15 V as described above.

Moreover, in this embodiment, the thickness of the silicon active layer (SOI layer) 103 is further reduced to, for example, about 5 nm as described above so that the threshold voltage value of the transistor is, in a reverse manner, increased to about 0.5 V. When the depth of the channel region (the thickness of the silicon active layer (SOI layer) 103) is about 10 nm (100 Å) or smaller, a subband is formed due to a quantum effect so that the threshold voltage value of the transistor increases in contrast to the case when it is larger than 10 nm (100 Å).

In this embodiment, the threshold voltage value of the transistor can be appropriately lowered when the thickness of the silicon active layer (SOI layer) 103 constituting the channel region is made as small as about 10 nm. Conversely, the threshold voltage value of the transistor is adjustable so as to be further increased when the thickness of the silicon active layer (SOI layer) 103 is made smaller than about 10 nm.

In such a case, a damascene gate process, a dry etching technique, and so on are used to reduce the thickness of the silicon active layer (SOI layer) 103 constituting the channel region within a range down to about 10 nm so that the threshold voltage value of the transistor can be lowered. On the other hand, the threshold voltage value of the transistor can be made higher by further reducing the depth of the channel region, that is, the thickness of the silicon active layer (SOI layer) 103, to a value smaller than about 10 nm, using a dry etching technique and so on. Therefore, in the fully-depleted SOI transistor, it is possible to form the plural transistors having different threshold voltages on the same semiconductor substrate (SOI substrate 104), thereby enhancing the performance of the semiconductor device.

Further, in this embodiment, only the silicon active layer (SOI layer) constituting the channel region is made thinner after the source region and the drain region are formed. Accordingly, the thickness of the silicon layer can be fully secured in the process of forming the source region and the drain region so that the possibility of causing cohesion at the time of the annealing in the hydrogen atmosphere or the like is low.

This embodiment is also applicable to the case when transistors with an LDD (Light-Doped-Drain) structure formed on the SOI substrate 104 are fabricated. It is also applicable to the case when polycrystalline silicon is used for the gate electrode layer.

Incidentally, it is also possible in this embodiment to form p-type MOS transistors on the SOI substrate 104 by introducing different impurities. It is also possible to provide n-type and p-type MOS transistors on the same SOI substrate to form CMOS transistors on the SOI substrate.

(Second Embodiment)

This embodiment will be explained with reference to FIG. 5A to FIG. 7C. In this embodiment, such a case will be explained where a plurality of n-type MOS transistors having different threshold voltages are formed on a common semiconductor substrate (for example, an SOI substrate), similarly to the "first embodiment". Note that the same reference numerals and symbols are used to designate components having the same structure as those in the "first embodiment", and detailed explanation thereof will be omitted.

FIG. 5A to FIG. 7C are cross sectional views showing n-type MOS transistors, which are formed on an SOI substrate, cut along a perpendicular direction to a longitudinal direction of a gate electrode layer.

In this embodiment, similarly to the "first embodiment", an SOI substrate 104 (a silicon supporting substrate 101/a buried silicon oxide film 102/a silicon active layer (SOI layer) 103) is used. Here, the thickness of the silicon active layer (SOI layer) 103 is about 30 nm (300 Å).

In this embodiment, similarly to the "first embodiment", a silicon oxide film (buffer oxide film) 107 is formed to have a thickness of about 3 nm over a surface of the silicon active layer (SOI layer) 103. Thereafter, a polycrystalline silicon film 108 and subsequently a silicon nitride film (SiNx film) 109 are formed to have a thickness of about 150 nm and about 30 nm respectively.

Figure 5A:
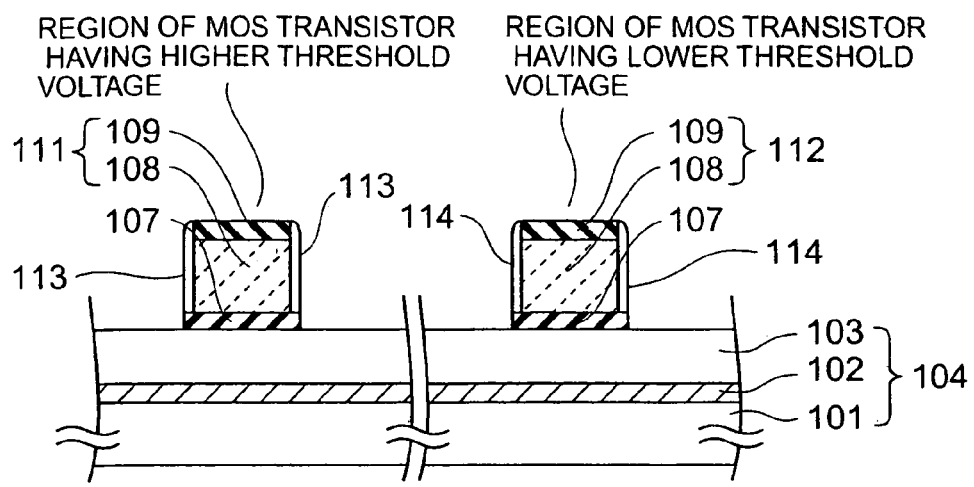
FIGS. 5A to 5C, FIGS. 6A to 6C, and FIGS. 7A to 7C are cross sectional views each showing a section of a semiconductor device according to a second embodiment of the present invention during manufacturing processes of this semiconductor device.

Next, through the same procedure as that of the "first embodiment", the silicon nitride film 109, the polycrystalline silicon film 108, and the silicon oxide film (buffer oxide film) 107 are processed in this order by a dry etching technique such as an RIE method using electron beams or the like to transfer a pattern. As a result, as shown in FIG. 5A, dummy gate patterns 111, 112 are formed. Sidewalls 113, 114 are formed along both sides of the dummy gate patterns 111, 112, using a silicon nitride film (SiNx film) or the like.

Figure 5B:
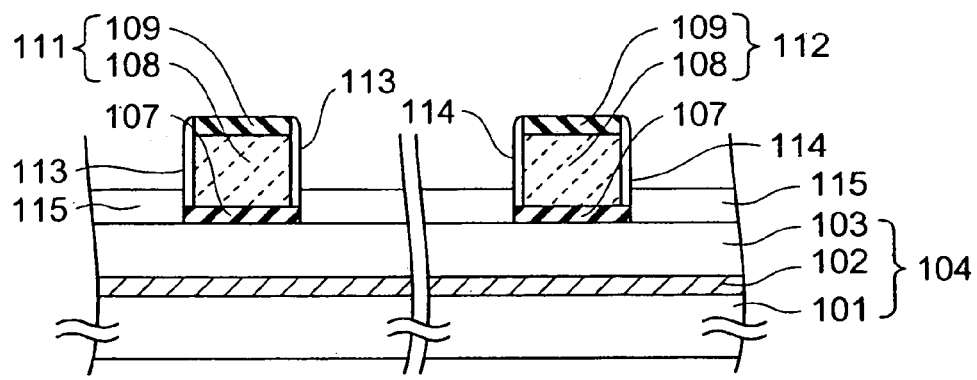

Next, as shown in FIG. 5B, silicon epitaxial layers 115 are formed over the silicon active layer (SOI layer) 103 on both sides of the sidewalls 113, 114, using an epitaxial growth method. The purpose thereof is to increase the thickness of portions of the silicon active layer (SOI layer) 103 which constitute source regions and drain regions.

Figure 5C:
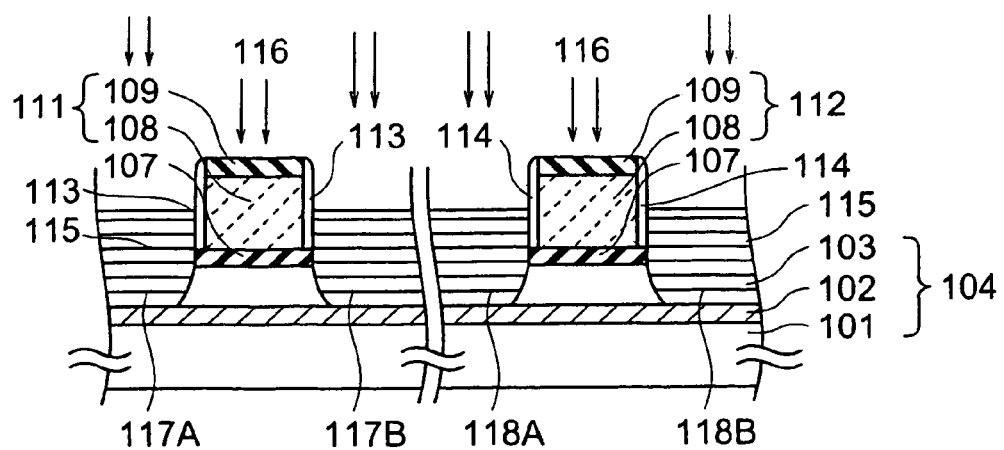

Next, as shown in FIG. 5C, with the dummy gate patterns 111, 112 and the sidewalls 113, 114 as masks, n-type impurities 116 (P (phosphorus) or As (arsenic)) are introduced using an ion implantation technique or the like to form high-concentration n+ impurity diffusion layers 117A, 118A constituting the source regions and high-concentration n+ impurity diffusion layers 117B, 118B constituting the drain regions.

Figure 6A:
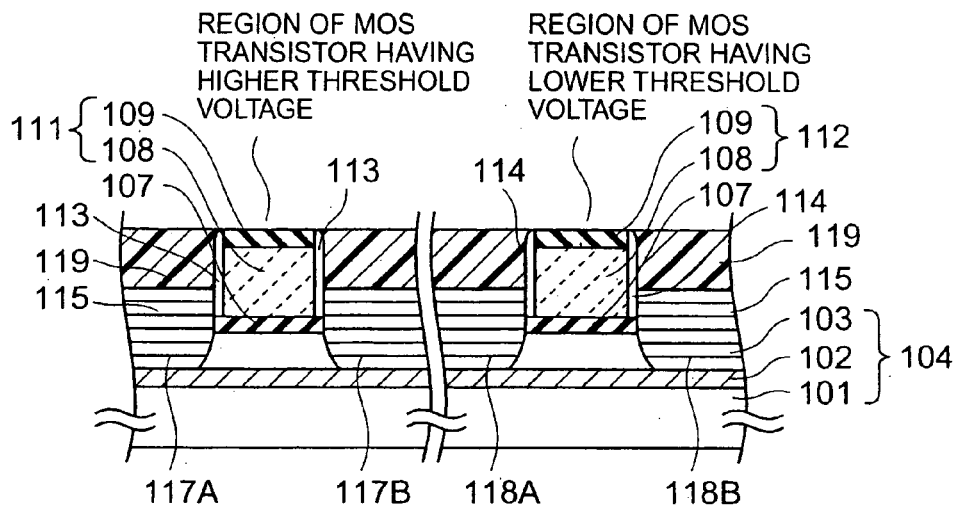

Next, as shown in FIG. 6A, a TEOS film 119 is deposited to have a thickness of about 230 nm as an interlayer insulation film, and thereafter, the entire surface is flattened by a CMP method or the like to expose surfaces of the dummy gate patterns 111, 112.

Next, the MOS transistors having different threshold voltages are formed separately on the same semiconductor substrate (SOI substrate 104). Here, as an example, a MOS transistor having a higher threshold voltage and a MOS transistor having a lower threshold voltage are formed in sequence on the same SOI substrate 104.

Figure 6B:
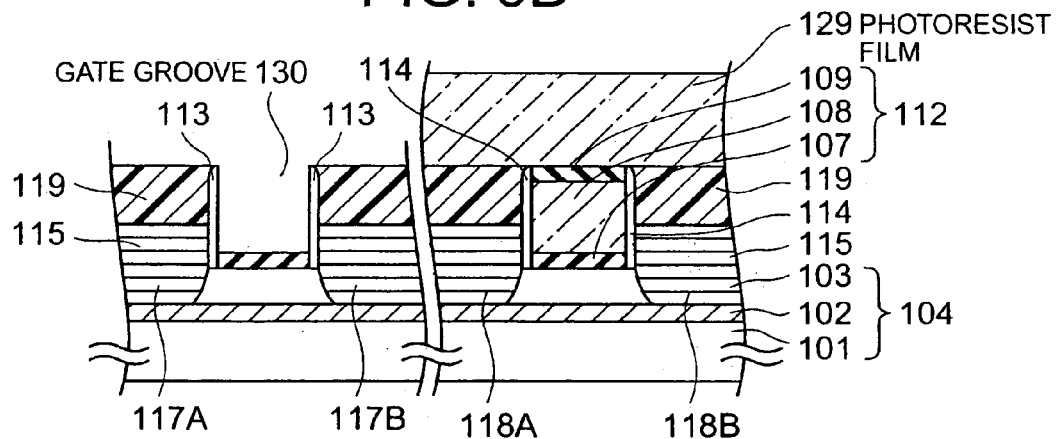

First, as shown in FIG. 6B, a region in which the transistor having the lower threshold voltage is to be formed is covered with a photoresist film 129. Thereafter, the dummy gate pattern 111 in a region in which the MOS transistor having the higher threshold-voltage is to be formed is removed by etching, a CDE method, or the like using thermal phosphoric acid to form a gate groove 130.

First, the pattern of the silicon nitride film 109 is removed by etching using thermal phosphoric acid, and the pattern of the polycrystalline silicon film 108 buried in the TEOS film 119 is subsequently removed by a CDE (Chemical Dry Etching) method. Thereafter, the silicon oxide film 107 lying on a bottom portion of the gate groove 130 is removed, using hydrofluoric acid (HF) or the like.

Figure 6C:
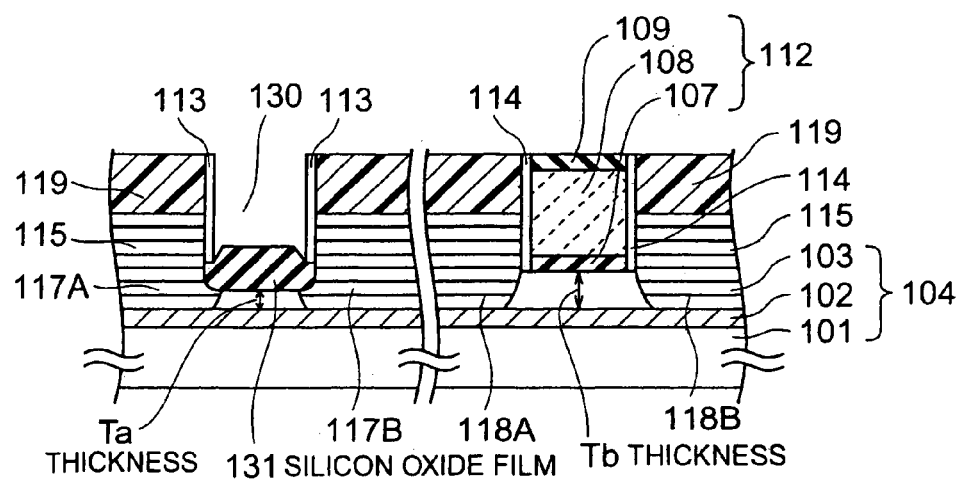

Next, as shown in FIG. 6C, the photoresist film 129 is removed and heat treatment is conducted to oxidize a part of the silicon active layer (SOI layer) 103 on the bottom portion of the gate groove 130 in the region in which the MOS transistor having the higher threshold voltage is to be formed, thereby forming a silicon oxide film ($SiO_2$ film) 131. Here, the film thickness of the silicon oxide film 131 is so controlled that the remaining silicon active layer (SOI layer) 103 that is not oxidized has a thickness of about 5 nm (50 Å). Here, forming of the silicon oxide film 131 can be conducted by plasma oxidization method instead of by ordinary heat oxidization method. In case of this, process is conducted at a low temperature. Therefore, it is adequate for miniaturization of a semiconductor device because diffusion layers do not expand beyond a necessary reason. Meanwhile, in the region in which the MOS transistor having the lower threshold voltage is to be formed, the silicon active layer (SOI layer) 103 is not oxidized and the thickness of about 30 nm (300 Å) is maintained.

Here, the thickness of the silicon active layer (SOI layer) 103 constituting a channel region of the MOS transistor having the higher threshold voltage is denoted by Ta, and the thickness of the silicon active layer (SOI layer) 103 of the MOS transistor having the lower threshold voltage is denoted by Tb.

Figure 7A:
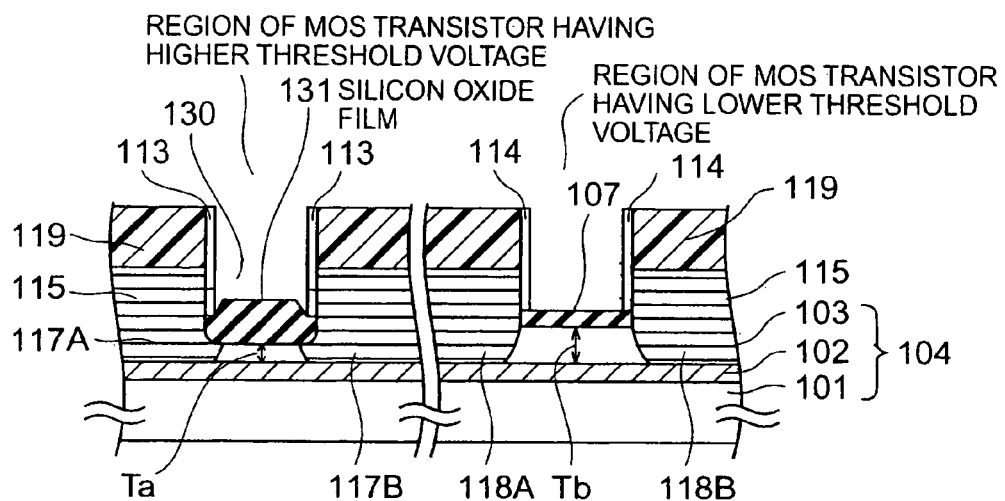

Next, as shown in FIG. 7A, the dummy gate pattern 112 in the region of the MOS transistor having the lower threshold voltage is removed. Here, the pattern of the silicon nitride film 109 inside an opening portion (gate groove 132) of the TEOS film 119 is removed by etching using thermal phosphoric acid, and the pattern of the polycrystalline silicon film 108 buried in the gate groove 132 is subsequently removed by a CDE-(Chemical Dry Etching) method.

Figure 7B:
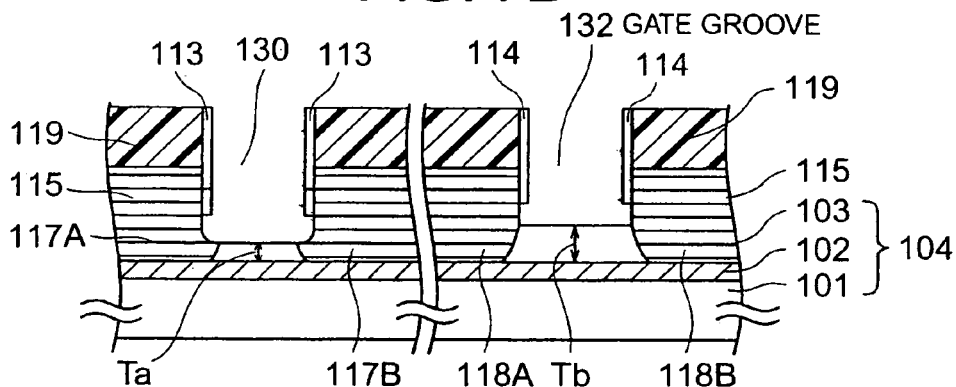

Next, as shown in FIG. 7B, the silicon oxide films 107, 131 are removed in this state, using hydrofluoric acid (HF) or the like. At this time, the thickness Ta of the silicon active layer (SOI layer) 103 constituting the channel region of the MOS transistor having the higher threshold voltage becomes about 5 nm (50 Å), and the thickness Tb of the silicon active layer 103 of the MOS transistor having the lower threshold voltage becomes about 30 nm (300 Å).

Figure 7C:
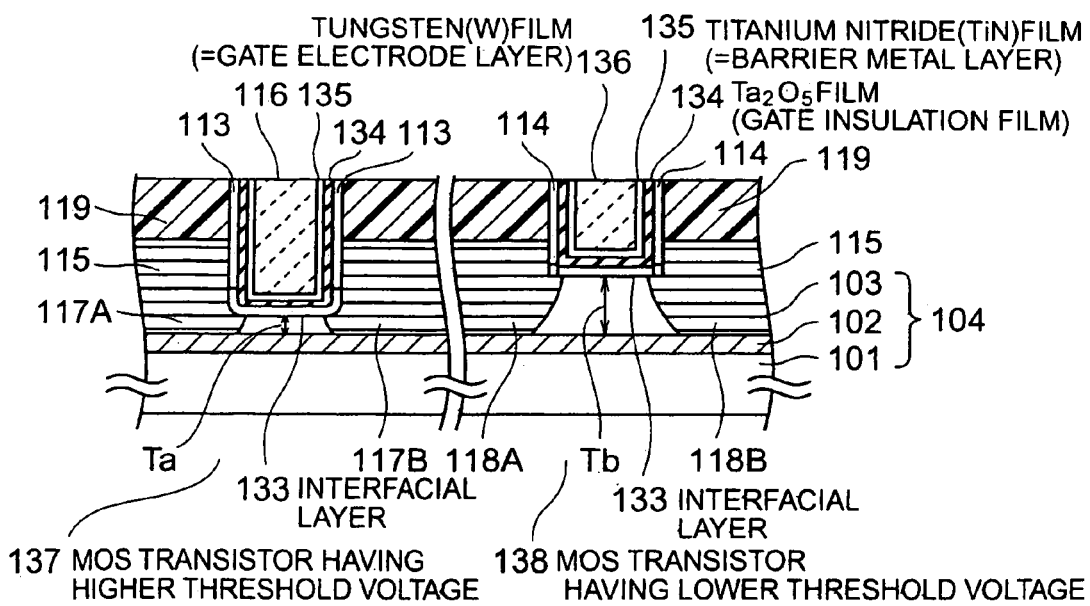

Next, as shown in FIG. 7C, a gate insulation film and subsequently a gate electrode layer are formed, being buried in each of the gate grooves 130, 132, thereby forming the plural n-type MOS transistors having the different threshold voltages.

Here, similarly to the "first embodiment", a high-permittivity film or the like is used as a material of the gate insulation film, and metal is used as a material of the gate electrode layer (a so-called metal gate electrode layer is formed) in order to achieve high speed and good controllability in each of the MOS transistors.

A high-permittivity $Ta_2O_5$ film 134 is formed as a gate insulation film in each of the gate grooves 130, 132 via a interfacial layer 133 (for example, an oxynitride film (NO film)). Thereafter, a titanium nitride film (TiN film) 135 constituting a barrier metal layer and a tungsten (W) material 136 as the gate electrode layer are formed being buried. Thus, high-permittivity $Ta_2O_5$ is used as the material of the gate insulation film, and tungsten (W), which is high melting point metal, is used as the material of the gate electrode layer (the so-called metal gate electrode layer is formed). In the above-described manner, a MOS transistor 137 having the higher threshold voltage and a MOS transistor 138 having the lower threshold voltage are formed on the SOI substrate 104.

As a specific procedure, the gate insulation film and the buried gate electrode of each of the MOS transistors are formed in sequence, using a damascene gate process as will be described below.

First, in order to remove a natural oxide film and so on in each of the bottom portions of the gate grooves 130, 132, hydrofluoric acid (HF) treatment is conducted to expose the surface of the silicon active layer (SOI layer) 103. Thereafter, the interfacial layer 133 (for example, an oxynitride film (NO film)) is formed to have a thickness of about 0.7 nm, using a CVD method or the like. Next, the $Ta_2O_5$ film 134 is formed thereover to have a film thickness of about 3 nm as the gate insulation film, using a CVD method or the like.

Next, the titanium nitride film (TiN film) 135 is formed to have a film thickness of 5 nm as the material of the barrier metal layer, using a CVD method or the like. Thereafter, the tungsten film (W film) 136 is formed to have a film thickness of about 150 nm in a layered state as the material of the gate electrode layer, using a CVD method, a blanket growth method, or the like.

Next, the titanium nitride (TiN) film 135 and the tungsten (W) film 136 are partly removed by a CMP method or the like to flatten the entire surface above the silicon active layer (SOI layer) 103. As a result, the gate electrode layer formed of tungsten (W) left buried inside each of the gate grooves 130, 132 is formed.

In the MOS transistors, the tungsten (W) films 136 buried inside the gate grooves 130, 132 serve as the gate electrode layers, and become constituent elements of the MOS transistors along with the source regions and the drain regions (the impurity diffusion layers 117A, 117B, 118A, 118B).

Here, the use of the $Ta_2O$ films 134 (gate insulation films) causes the MOS transistors to have a performance characteristic (controllability) corresponding to a film thickness of 1.5 nm or smaller in terms of a film thickness of a silicon oxide film. Consequently, controllability of the MOS transistors can be enhanced.

In MOS transistor forming processes, heat treatment at a high temperature of about 800° C. to about 1000° C. is generally conducted after a gate insulation film and a gate electrode layer are formed. Consequently, atoms of metal constituting the gate electrode layer (metal gate electrode layer) diffuse into the gate insulation film to easily cause the deterioration in withstand voltage of the gate insulation film. In addition, a low relative permittivity thin film is formed on an interface between a high permittivity film (high-k film) such as the $Ta_2O$ film 134 and the silicon active layer (SOI layer) 103 to greatly increase an effective film thickness of the gate insulation film so that controllability is liable to get low.

In contrast, according to this embodiment, the source regions and the drain regions are formed prior to the gate electrode layers in the MOS transistor forming processes. Therefore, heat treatment at a high temperature of 450° C. or higher is not especially required after the gate electrode layers are formed. Hence, for the gate insulation film, usable besides the $Ta_2O_5$ film as a high-permittivity film or in some cases a ferroelectric film are a $TiO_2$ film, an SiN film, a $BaTiO_3$ film, an $SrTiO_3$ film, an $HfO_2$ film, a $ZrO_2$ film, a $La_2O_3$ film, a $Gd_2O_3$ film, a $Y_2O_3$ film, a $CaF_2$ film, a $CaSnF_2$ film, a $CeO_2$ film, a Yttria Stabilized Zirconia film, an $Al_2O_3$ film, a $ZrSiO_4$ film, an $HfSiO_4$ film, a $Gd_2SiO_5$ film, a $2La_2O_3$ film/$3SiO_2$ film (layered film), and so on. Further, for the gate electrode layer, TiN, WN, Al, Ru, W, Co, Ta, Pt, WSi and so on, alloys or layered structures of these materials are usable besides tungsten (W) as a metal material. Gate electrodes consisting of different materials can exist in the same wafer.

Thereafter, a wiring structure and so on are formed in an upper layer of each of the MOS transistors through the same procedure as that explained in the "first embodiment".

In the foregoing manner, the plural fully-depleted n-type MOS transistors having different threshold, voltages are formed on the SOI substrate 104. Here, in the transistor 138 having the lower threshold voltage, the thickness Tb of the silicon active layer (SOI layer) 103 constituting the channel region is about 30 nm (300 Å), which causes the threshold voltage value to be about 0.15 V. Meanwhile, in the transistor 137 having the higher threshold voltage, the thickness Ta of the silicon active layer (SOI layer) 103 constituting the channel region is about 5 nm (50 Å), which causes the threshold voltage value to be about 0.5 V.

When a metal material is used as a gate electrode layer, a threshold voltage value of a transistor increases more easily than in the case when polycrystalline silicon is used, as stated above. In this embodiment, the thickness of the silicon active layer (SOI layer) 103 constituting the channel region is made as small as about 30 nm, which enables the reduction in the threshold voltage value of the transistor to about 0.15 V as described above.

Moreover, in this embodiment, the thickness of the silicon active layer (SOI layer) 103 is further reduced to, for example, about 5 nm as described above so that the threshold voltage value of the transistor is, in a reverse manner, increased to about 0.5 V. When the depth of the channel region (the thickness of the silicon active layer (SOI layer) 103) is about 10 nm (100 Å) or smaller, a subband is formed due to a quantum effect so that the threshold voltage value of the transistor increases in contrast to the case when it is larger than 10 nm (100 Å).

In this embodiment, the threshold voltage value of the transistor can be appropriately lowered when the thickness of the silicon active layer (SOI layer) 103 constituting the channel region is made as small as about 10 nm. Conversely, the threshold voltage value of the transistor is adjustable so as to be further increased when the thickness of the silicon active layer (SOI layer) 103 is made smaller than about 10 nm.

In such a case, a damascene gate process, oxidization, an etching technique, and so on are used to reduce the thickness of the silicon active layer (SOI layer) 103 constituting the channel region within a range up to about 10 nm so that the threshold voltage value of the transistor can be lowered. On the other hand, the threshold voltage value of the transistor can be made higher by further reducing the depth of the channel region, that is, the thickness of the silicon active layer (SOI layer) 103, to a value smaller than about 10 nm, through silicon oxidization and dry etching as described above. Therefore, in the fully-depleted SOI transistor, it is possible to form the plural transistors having different threshold voltages on the same semiconductor substrate (SOI substrate 104), thereby enhancing the performance of the semiconductor device.

In other words, the channel regions (SOI) of the silicon active layer (SOI layer) are made different in thickness on the same semiconductor substrate by the damascene gate process so that the plural SOI-MOS transistors having different threshold voltages (Vth) can be easily formed.

In this embodiment, the silicon oxide film 131 is formed in a surface portion of the silicon active layer (SOI layer) 103 to reduce the thickness of the silicon active layer (SOI) corresponding to the channel region. This silicon oxide film 131 can be easily removed by wet etching using hydrofluoric acid (HF) or the like. Thus, in this embodiment, the portion of the silicon active layer 103 constituting the channel region is not shaved, unlike the case of using a CDE method, an RIE method, or the like so that electric properties such as carrier mobility in a semiconductor device can be enhanced without impairing the interface with the gate insulation film (example: a $Ta_2O_5$ film).

This embodiment is also applicable to the case when transistors with an LDD (Light-Doped-Drain) structure formed on the SOI substrate 104 are fabricated. It is also applicable to the case when polycrystalline silicon is used for the gate electrode layer.

Incidentally, it is also possible in this embodiment to form p-type MOS transistors on the SOI substrate 104 by introducing different impurities. It is also possible to provide n-type and p-type MOS transistors on the same SOI substrate to form CMOS transistors on the SOI substrate.

(Third Embodiment)

This embodiment will be explained with reference to FIG. 8A to FIG. 10B. In this embodiment, an SOI substrate is used as an example similarly to the above-described first and second embodiments. MOS transistors in each of which a silicon (Si) thin film (a so-called silicon (Si)-fin film) constitutes a channel region are formed on this SOI substrate.

Figure 8A:
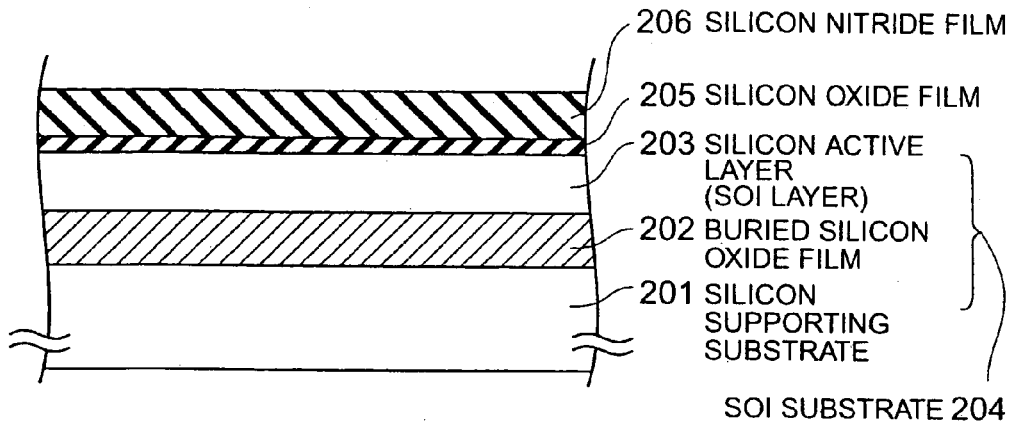
FIGS. 8A to 8B, FIGS. 9A to 9B, and FIGS. 10A to 10B are cross sectional views each showing a section of a semiconductor device according to a third embodiment of the present invention during manufacturing processes of this semiconductor device.
Figure 8B:
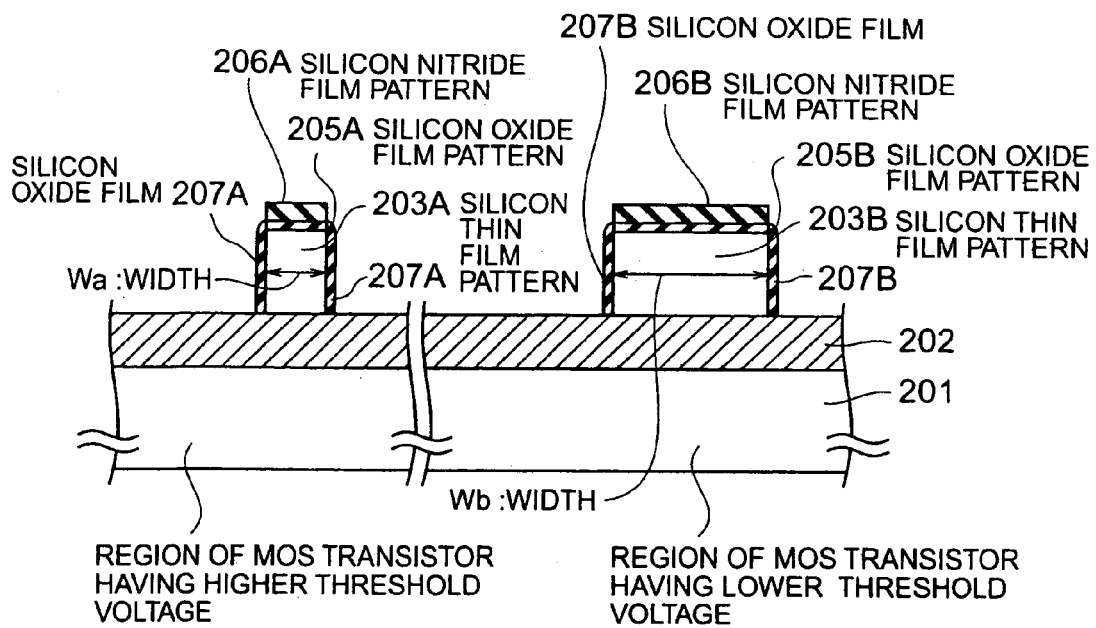
Figure 9A:
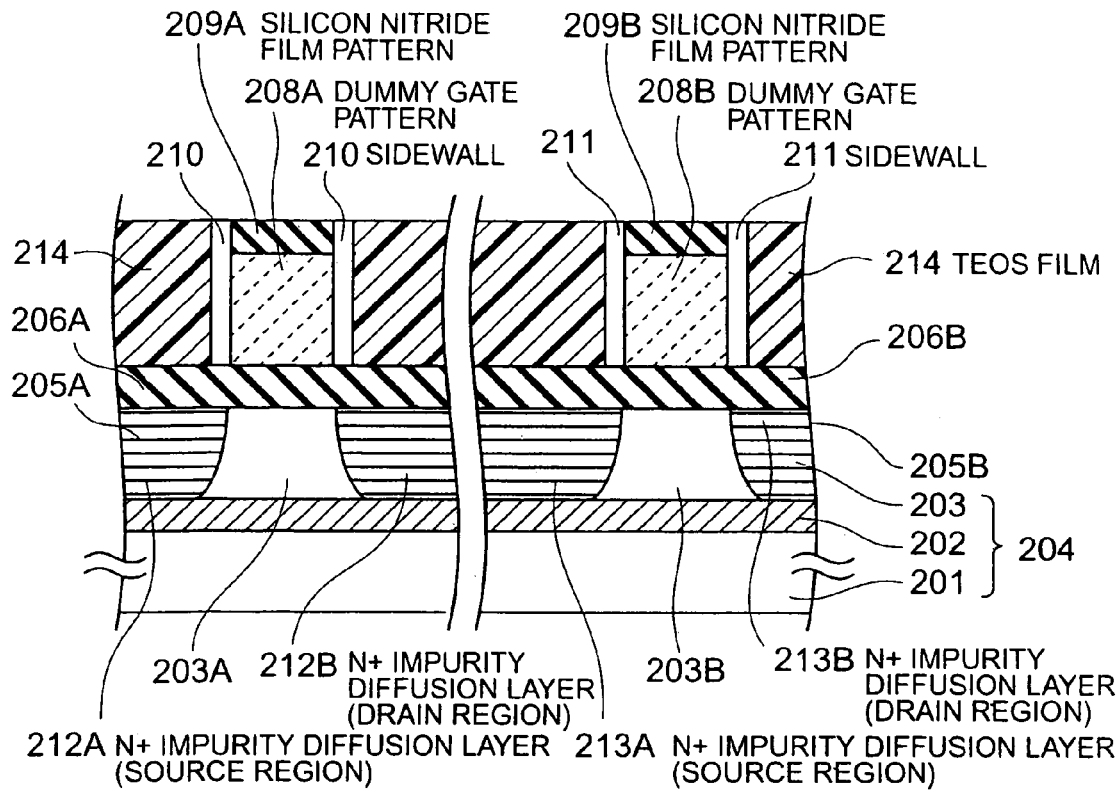
Figure 9B:
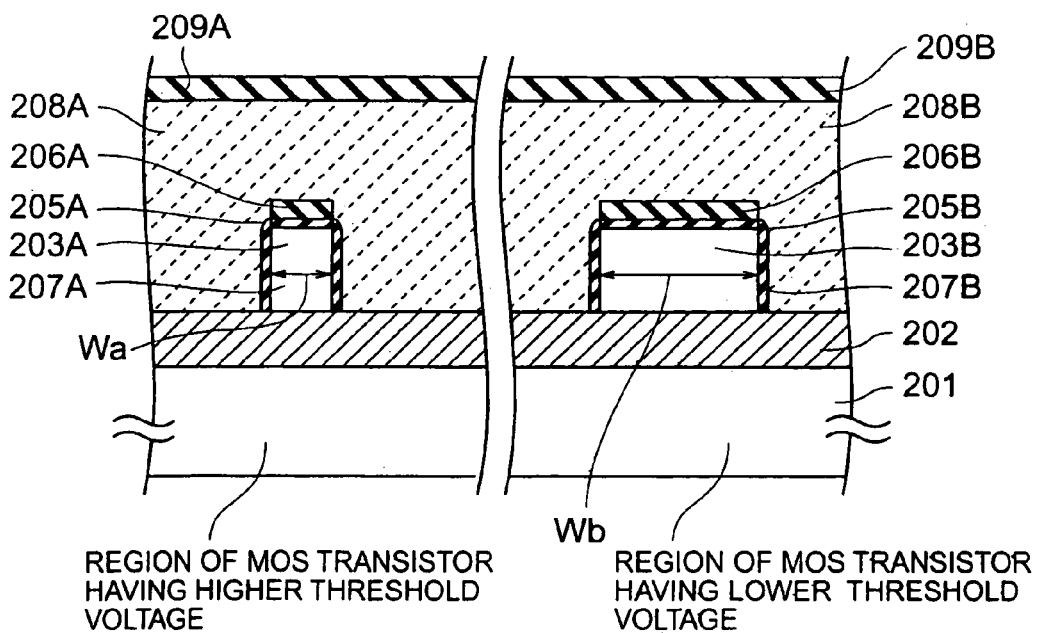
Figure 10A:
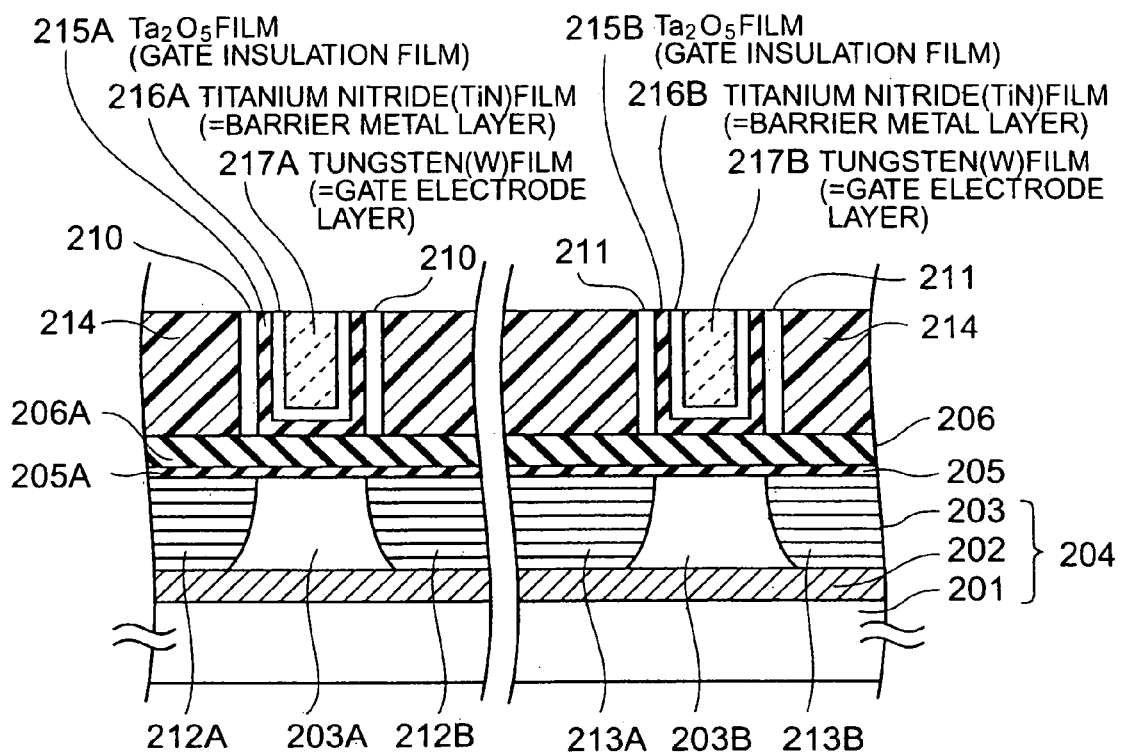
Figure 10B:
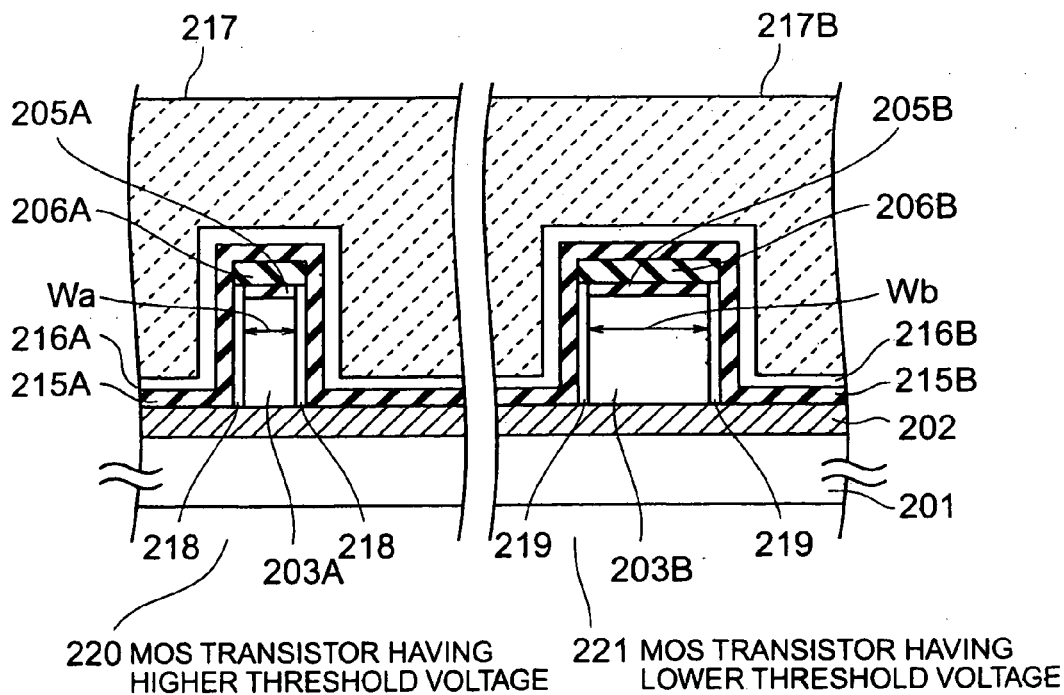

Note that FIG. 8A, FIG. 9A, and FIG. 10A show cross sectional views taken along a perpendicular direction to a longitudinal direction of a gate electrode layer. FIG. 8B, FIG. 9B, and FIG. 10B are cross sectional views taken along a perpendicular direction to a longitudinal direction of the channel region.

First, as shown in FIG. 8A, a silicon active layer (SOI layer) 203 to which film-thinning has been applied up to a predetermined depth is formed over a silicon supporting substrate 201 via a buried silicon oxide film 202. Thus, an SOI substrate 204 is constituted of the silicon supporting substrate 201, the buried silicon oxide film 202, and the silicon active layer (SOI layer) 203.

Here, the thickness of the silicon active layer (SOI layer) 203 is, for example, about 50 nm (500 Å). A silicon oxide film 205 is formed to have a film thickness of about 3 nm over a surface portion of the silicon active layer (SOI layer) 203, and a silicon nitride film 206 is formed thereover to have a film thickness of about 10 nm by a CVD method or the like.

Next, a pattern of a photoresist film is formed over the silicon nitride film 206 by electron beams or the like. With this pattern as a mask, the silicon nitride film 206, the silicon oxide film 205, and the silicon active layer (SOI layer) 203 are processed in sequence, using a dry etching technique such as an RIE method.

Here, as shown in FIG. 8B (a cross sectional view cut along a perpendicular direction to the cut direction of FIG. 8A), a silicon thin film pattern 203A with a width Wa of about 5 nm (50 Å), a silicon oxide film pattern 205A, and a silicon nitride film pattern 206A are formed on the buried silicon oxide film 202 in a region of a MOS transistor having a higher threshold voltage. Concurrently, a silicon thin film pattern 203B with a width Wb of about 30 nm (300 Å), a silicon oxide film pattern 205B, and a silicon nitride film pattern 206B are formed on the buried silicon oxide film 202 in a region of a MOS transistor having a lower threshold voltage.

Incidentally, a silicon oxide film 207 is formed to have a film thickness of about 2 nm over a surface portion of side faces of the silicon thin film pattern 203A. Further, a silicon oxide film 207B is formed to have a film thickness of about 2 nm over a surface portion of side faces of the silicon thin film pattern 203B.

Next, as shown in FIG. 9A, dummy gate patterns 208A, 208B using a polycrystalline silicon film as a material thereof, silicon nitride film patterns 209A, 209B, and sidewalls 210, 211 along side walls thereof are formed. Further, impurities are introduced to positions of a source region and a drain region in the region of the MOS transistor having the higher threshold voltage to form high-concentration n+ impurity diffusion layers 212A, 212B. Similarly, high-concentration n+ impurity diffusion layers 213A, 213B are formed also in the region of the MOS transistor having the lower threshold voltage. Thereafter, the entire surface is covered with a TEOS film 214 and flattened to expose the silicon nitride film patterns 209A, 209B.

At this time, as shown in FIG. 9B (a cross sectional view cut along a perpendicular direction to the cut direction of FIG. 9A), the silicon thin film pattern 203A constituting the channel region is covered with the dummy gate pattern 208A using the polycrystalline silicon film as the material thereof and the silicon nitride film pattern 209A. The silicon thin film pattern 203B constituting the channel region is covered with the dummy gate pattern 208B using the polycrystalline silicon film as the material thereof and the silicon nitride film pattern 209B.

Specifically, the dummy gate patterns are formed in the regions of the n-type MOS transistors having the higher threshold voltage and the lower threshold voltage as will be described below, using a damascene gate process. First, the polycrystalline silicon film is formed to have a film thickness of about 150 nm over a predetermined region on the silicon nitride film patterns 206A, 206B so as to cover the silicon thin film patterns 203A, 203B provided in the above-described manner. Thereafter, the surface of the polycrystalline silicon film is flattened, using a CMP method or the like, and the silicon nitride film is formed thereover to have a film thickness of about 30 nm. Thereafter, the photoresist pattern is formed using electron beams or the like. Using this photoresist pattern as a mask, the layered silicon nitride film and polycrystalline silicon film are processed in sequence to a predetermined shape and size, using a dry etching technique such as an RIE method. Thus, the layered dummy gate pattern 208A and silicon nitride film pattern 209A are formed over the region of the MOS transistor having the higher threshold voltage as described above. Meanwhile, the layered dummy gate pattern 208B and silicon nitride film pattern 209B are formed also over the region of the MOS transistor having the lower threshold voltage. Here, the silicon nitride film patterns 206A, 206B serve as so-called etching stoppers to protect the silicon thin film patterns 203A, 203B respectively in the process of forming the dummy gate patterns 208A, 208B.

Next, the sidewalls 210, 211 are formed along both side faces of the dummy gate patterns 208A, 208B, using the silicon nitride film and so on. Thereafter, using the dummy gate pattern 208A and the sidewalls 210 in the region of the MOS transistor having the higher threshold voltage as masks, n impurities (phosphorus (P) or arsenic (As)) are introduced into positions of the source region and the drain region to form the high-concentration n+ impurity diffusion layers 212A, 212B as previously described. Similarly, in the region of the MOS transistor having the low threshold voltage, using the dummy gate pattern 208B and the sidewalls 211 as masks, n impurities are introduced to form the high-concentration n+impurity diffusion layers 213A, 213B.

Incidentally, it is possible here to form the high-concentration n+ impurity diffusion layers 212A, 212B, 213A, 213B by introducing the n impurities, using a generally known method such as an oblique ion implantation method or a solid phase diffusion method.

Next, the TEOS film 214 is formed to have a film thickness of about 200 nm and flattened by a CMP method to expose the surfaces of the dummy gate patterns 208A, 208B.

Thereafter, though not particularly shown in the drawings, the dummy gate pattern 208A and the silicon nitride film 209A in the region of the MOS transistor having the higher threshold voltage and the dummy gate pattern 208B and the silicon nitride film 209B in the region of the MOS transistor having the lower threshold voltage are removed simultaneously, using a CDE method or the like to form gate grooves in the respective regions.

Next, a gate insulation film and subsequently a gate electrode layer are formed being buried in each of the gate grooves to form the n-type MOS transistors having the higher threshold voltage and the lower threshold voltage. Here, similarly to the above-described embodiments, a high-permittivity film, a ferroelectric film, or the like is used as a material of the gate insulation film, and metal is used as a material of the gate electrode layer (a so-called metal gate electrode layer is formed) in order to achieve high speed and good controllability in each of the MOS transistors.

Here, as shown in FIG. 10A, a $Ta_2O_5$ film 215A which is a high-permittivity film is formed as the gate insulation film along an inner face of the gate groove in the region of the n-type MOS transistor having the higher threshold voltage. A titanium nitride film (TiN film) 216A constituting a barrier metal layer is formed thereover, and a tungsten film (W film) 217A is subsequently formed as the gate electrode layer, both being buried in the gate groove in sequence. Similarly, in the region of the n-type MOS transistor having the lower threshold voltage, a $Ta_2O_5$ film 215B which is a high-permittivity film is formed as the gate insulation film along the inner face of the gate groove. Thereafter, a titanium nitride film (TiN film) 216B constituting a barrier metal layer is formed thereover, and a tungsten film (W film) 217B is subsequently formed as a gate electrode layer, both being buried in the gate groove in sequence.

In this way, for example, the $Ta_2O_5$ film as a high-permittivity film is used as the material of the gate insulation film, and the tungsten film as high melting point metal is used as the material of the gate electrode layer (a so-called metal gate electrode layer is formed).

The side faces of the silicon thin film patterns 203A, 203B constituting the channel regions are protected in advance with silicon nitride films 218, 219 as shown in FIG. 10B (a cross sectional view cut along a perpendicular direction to the cut direction of FIG. 10A). Thereafter, the $Ta_2O_5$ films 215A, 215B (gate insulation films), the titanium nitride films (TiN films) 216A, 216B (barrier metal layers), and the tungsten (W) films 217A, 217B (gate electrode layers) are formed in sequence so as to cover the silicon thin film patterns 203A, 203B constituting the channel regions from the right and left sides and from the above.

In the foregoing manner, a MOS transistor 220 having the higher threshold voltage and a MOS transistor 221 having the lower threshold voltage are formed.

As a specific procedure, the gate insulation films and the buried gate electrode layers of the MOS transistors are formed in sequence as will be described below.

First, hydrofluoric acid (HF) treatment is applied to a bottom portion of the gate groove in the region of the n-type MOS transistor having the higher threshold voltage to expose the side faces of the silicon thin film 203A. Thereafter, the silicon nitride film 218 (for example, an oxynitride film (NO film)) is formed to have a thickness of about 0.7 nm over the surface portion thereof, using a CVD method or the like. Concurrently, hydrofluoric acid (HF) treatment is applied to the bottom portion of the gate groove in the region of the n-type MOS transistor having the lower threshold voltage to similarly form the silicon nitride film 219 (for example, an oxynitride film (NO film)) to have a thickness of about 0.7 nm over a surface portion of the side faces of the silicon thin film 203B (refer to FIG. 10B).

Next, the $Ta_2O_5$ films 215A, 215B are formed to have a film thickness of about 3 nm as the gate insulation films inside the regions of the n-type MOS transistors having the higher threshold voltage and the lower threshold voltage, using a CVD method or the like. Further, the titanium nitride films (TiN films) 216A, 216B are thereafter formed to have a film thickness of 5 nm as the materials of the barrier metal layers. Next, the tungsten films (W films) 217A, 217B are formed to have a film thickness of about 150 nm as the materials of the gate electrode layers, using a CVD method, a blanket growth method, or the like.

Next, the titanium nitride (TiN) films 216A, 216B and the tungsten (W) films 217A, 217B are partly removed by a CMP method to flatten the entire surface over the silicon active layer (SOI layer) 103, and the tungsten (W) films are left buried inside the respective gate grooves, thereby forming the gate electrode layers. At this time, the film thickness of the gate insulation films is about 1.5 nm or smaller in terms of the film thickness of the silicon oxide film.

In the MOS transistor forming processes shown in this embodiment, the source regions and the drain regions are formed followed by forming of the gate electrode layers. Therefore, heat treatment at a high temperature of 450° C. or higher is not required thereafter. Accordingly, the high-permittivity films or the ferroelectric films, and the metal materials (TiN, WN, Al, W, Ru, or the like), which are shown in the first and second embodiments previously described, are usable for the gate insulation films and the gate electrodes, respectively.

Next, a wiring layer structure and so on are formed in an upper layer of each of the MOS transistors formed in the above-described manner through generally known fabrication processes. Specifically, a TEOS film is formed as an interlayer insulation film by a CVD method or the like. Thereafter, contact holes are formed in the TEOS film at respective positions above the gate electrode layer, the source region, and the drain region, and a metal wiring layer (for example, a copper (Cu) wiring layer) in the upper layer is formed to establish electrical connection to the gate electrode layer, the source region, and the drain region.

In this embodiment, the widths Wa, Wb of the silicon thin film patterns 203A, 203B are made different so that the threshold voltages of the two MOS transistors are made different.

In this embodiment, the threshold voltage values of the transistors can be appropriately lowered when the widths Wa, Wb of the silicon thin film patterns 203A, 203B are reduced to about 10 nm. Conversely, the threshold voltage values of the transistors can be adjusted to become higher by making the widths Wa, Wb of the silicon thin film patterns 203A, 203B smaller than about 10 nm.

It is to be understood that, in these embodiments, other changes can be made without departing from the meaning and sprit of the present invention.

What is claimed is:

1. A manufacturing method of a semiconductor device, comprising:
    forming a first and a second dummy gate pattern on a silicon layer formed over a semiconductor substrate via an insulation film;
    forming impurity diffusion layers at positions of source regions and drain regions by introducing impurities into said silicon layer, using said first and said second dummy gate pattern as masks;
    forming an insulation film over said silicon layer so as to bury said first and said second dummy gate pattern;
    removing said first and said second dummy gate pattern to form a first and a second groove in said insulation film;
    etching said silicon layer in said first groove to reduce a thickness of a portion corresponding to a channel region of said silicon layer;
    forming gate insulation films over said silicon layer in said first and said second groove; and
    forming gate electrode layers over said gate insulation films in said first and said second groove.

2. A manufacturing method of a semiconductor device according to claim 1,
    wherein, in reducing the thickness of the portion corresponding to the channel region of said silicon layer, the portion corresponding to the channel region of said silicon layer is formed to be 10 nm or smaller in thickness.

* * * * *